United States Patent [19]

Ikeda et al.

[11] Patent Number: 4,993,036
[45] Date of Patent: Feb. 12, 1991

[54] SEMICONDUCTOR LASER ARRAY INCLUDING LASERS WITH REFLECTING MEANS HAVING DIFFERENT WAVELENGTH SELECTION PROPERTIES

[75] Inventors: Sotomitsu Ikeda; Masahiro Okuda, both of Atsugi, Japan

[73] Assignee: Canon Kabushiki Kaisha, Japan

[21] Appl. No.: 412,983

[22] Filed: Sep. 26, 1989

[30] Foreign Application Priority Data

Sep. 28, 1988 [JP] Japan .................. 63-240965
Oct. 20, 1988 [JP] Japan .................. 63-262890

[51] Int. Cl.$^5$ .................................. H01S 3/19
[52] U.S. Cl. ........................ 372/50; 372/23; 372/45; 372/46; 372/49; 372/96; 372/97; 372/102
[58] Field of Search ............. 372/50, 45, 46, 43, 372/23, 49, 97, 96, 102, 101

[56] References Cited

U.S. PATENT DOCUMENTS

| | | | |
|---|---|---|---|
| 4,318,058 | 3/1982 | Mito et al. ...................... | 372/50 |
| 4,532,632 | 7/1985 | Yamashita ...................... | 372/50 |
| 4,740,978 | 4/1988 | Göbel et al. .................... | 372/50 |
| 4,813,054 | 3/1989 | Plumb ........................... | 372/96 |
| 4,817,110 | 3/1989 | Tokuda et al. ................. | 372/45 |
| 4,887,255 | 12/1989 | Handa et al. .................. | 369/112 |
| 4,896,328 | 1/1990 | Sekiguchi ...................... | 372/45 |

FOREIGN PATENT DOCUMENTS

| | | |
|---|---|---|
| 0194355 | 9/1986 | European Pat. Off. . |
| 0254568 | 1/1988 | European Pat. Off. . |
| 3228586 | 2/1983 | Fed. Rep. of Germany . |
| 55-11341 | 1/1980 | Japan . |
| 58-110087 | 6/1983 | Japan . |
| 0236276 | 11/1985 | Japan ................. 372/23 |
| 0251183 | 11/1986 | Japan ................. 372/96 |
| 63-148692 | 6/1988 | Japan . |

OTHER PUBLICATIONS

*Applied Physics Letters*, vol. 51, No. 21, Nov. 23, 1987, pp. 1664-1666, Tokuda, Y., et al., "Dual-Wavelength Emission from a Twin-Stripe Single Quantron Well Laser."

*Electronics Letters*, vol. 20, No. 11, May 1984, pp. 463-464, Hirayama, Y., et al., "Monolithic Integration of Low-Threshold-Current 1.3 $\mu$m GaIn AsP/InP DfB Lasers."

Primary Examiner—Georgia Epps
Attorney, Agent, or Firm—Fitzpatrick, Cella, Harper & Scinto

[57] ABSTRACT

Disclosed is a semiconductor laser array including a plurality of semiconductor lasers each having an active layer having a quantum well structure with at least two quantum levels. The semiconductor lasers have reflecting means having different wavelength selection properties.

23 Claims, 11 Drawing Sheets

FIG. 2A₁
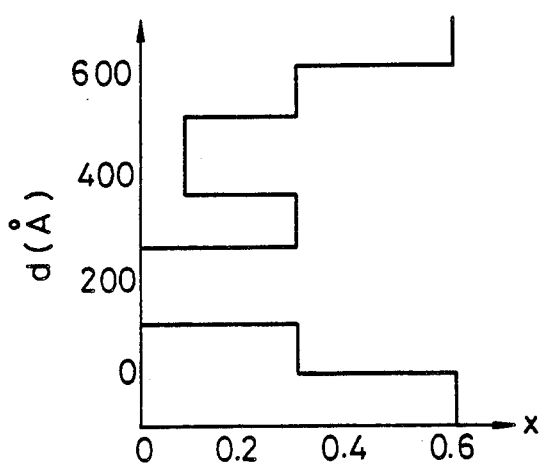
FIG. 2A₂
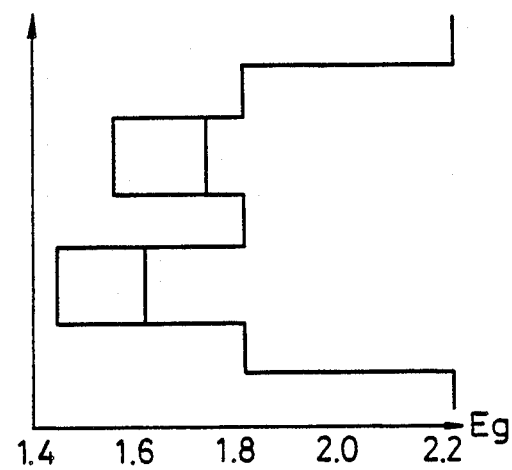
FIG. 2B₁
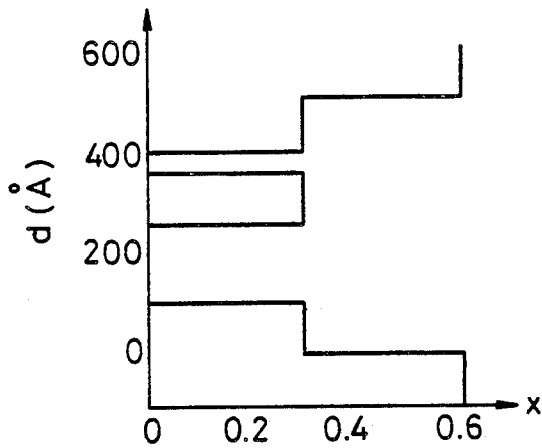
FIG. 2B₂
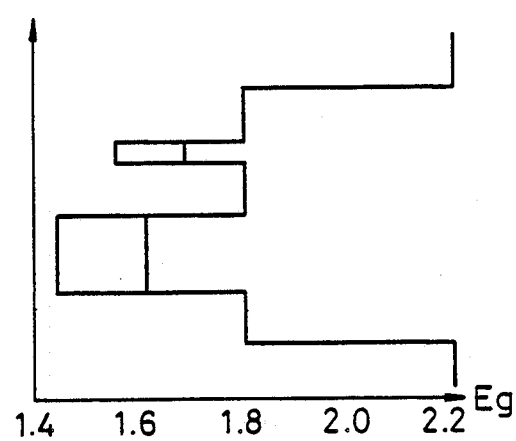

FIG. 2C₁ 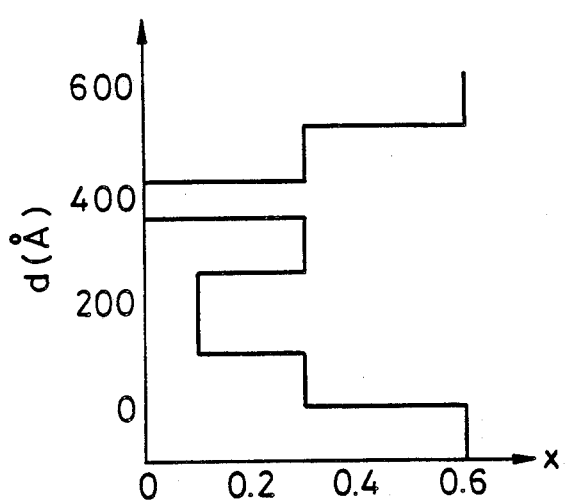
FIG. 2C₂ 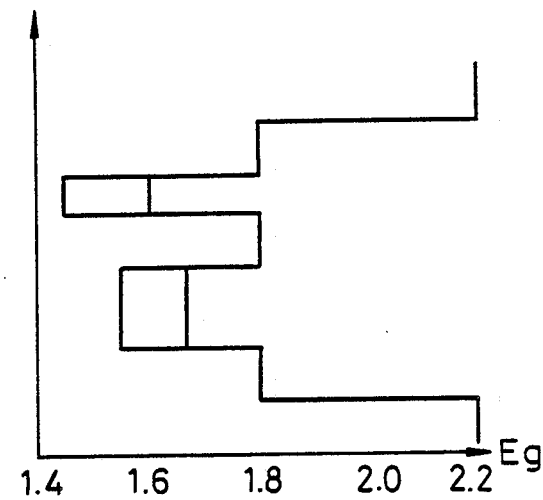

SEMICONDUCTOR LASER ARRAY INCLUDING LASERS WITH REFLECTING MEANS HAVING DIFFERENT WAVELENGTH SELECTION PROPERTIES

BACKGROUND OF THE INVENTION

1. Field of the Invention

This invention relates to a semiconductor laser array which emits a plurality of laser lights having different wavelengths and which is suitable for use in transmission or processing of multi-wavelength-light information.

2. Description of the Prior Art

Conventional semiconductor laser arrays of this kind are known in which a plurality of semiconductor lasers having a distributed feed back (DFB) structure of distributed Bragg reflector (DBR) are formed on a substrate in a monolithic construction manner and the diffraction gratings for the respective lasers are formed with different pitches, and which thereby emits a plurality of laser light beams having different wavelengths. In this type of laser array, however, the difference between the wavelengths of the lights emitted from the lasers is small and is at most several nanometers if the laser array is designed to make the characteristics of the lasers uniform.

A known type of laser array designed to emit a plurality of laser lights having wavelengths greatly different from each other based on forming an active layer of each laser in a quantum well structure is proposed in U.S. Pat. No. 4,817,110, particularly in the statement between line 16 in col. 21 and line 6 in col. 24 of the specification thereof. This laser array is constructed in such a manner that a plurality of semiconductor lasers having active layers having a quantum well structure are arranged on a substrate so that internal losses or reflection losses of the respective layers are different from each other. For example, as stated at lines 59 to 62 in col. 23 of the same specification, the mirror loss of the respective laser may be varied by varying the reflectivity of the mirror of the respective laser by such as a method of end facet coating.

However, the mirror loss of this laser array is not determined with respect to the oscillation wavelength of each laser light, and it is not assured that all the lasers can effect oscillation under suitable conditions. For this reason, there is a risk of a reduction in the emission efficiency or dispersion of the characteristics of the lasers.

SUMMARY OF THE INVENTION

It is an object of the present invention to provide a semiconductor laser array free from the problems of the conventional art and capable of emitting laser lights having different wavelengths from respective unit lasers at improved efficiency and with uniform characteristics.

According to one aspect of the invention, there is provided a semiconductor laser array comprising a plurality of lasers having, within an active layer, quantum well structure with at least two quantum well levels for generating, respectively and independently of each other, laser light beams of mutually different oscillation wavelengths. There are also provided reflecting means associated with each of the quantum well levels. The reflecting means have wavelength selection properties corresponding to each of the mutually different oscillation wavelengths.

According to another aspect of the invention, there is provided a semiconductor laser array which comprises first and second semiconductor lasers and first and second reflecting means provided, respectively, for the first and second semiconductor lasers. Each of the semiconductor lasers has, within an active layer, a quantum well structure with at least two quantum levels. The first and second semiconductor lasers are constructed to emit light having first and second wavelengths, respectively. The active layers of the two semiconductor lasers are formed together in a substrate in a monolithic construction. The first reflecting means are constructed to reflect light of the first wavelength with a reflectance which is higher than that with which the first reflecting means reflects light having the second wavelength. The second reflecting means are constructed to reflect light of the second wavelength with a reflectance with is higher than that with which the second reflecting means reflects light having the first wavelength.

Figure 1:
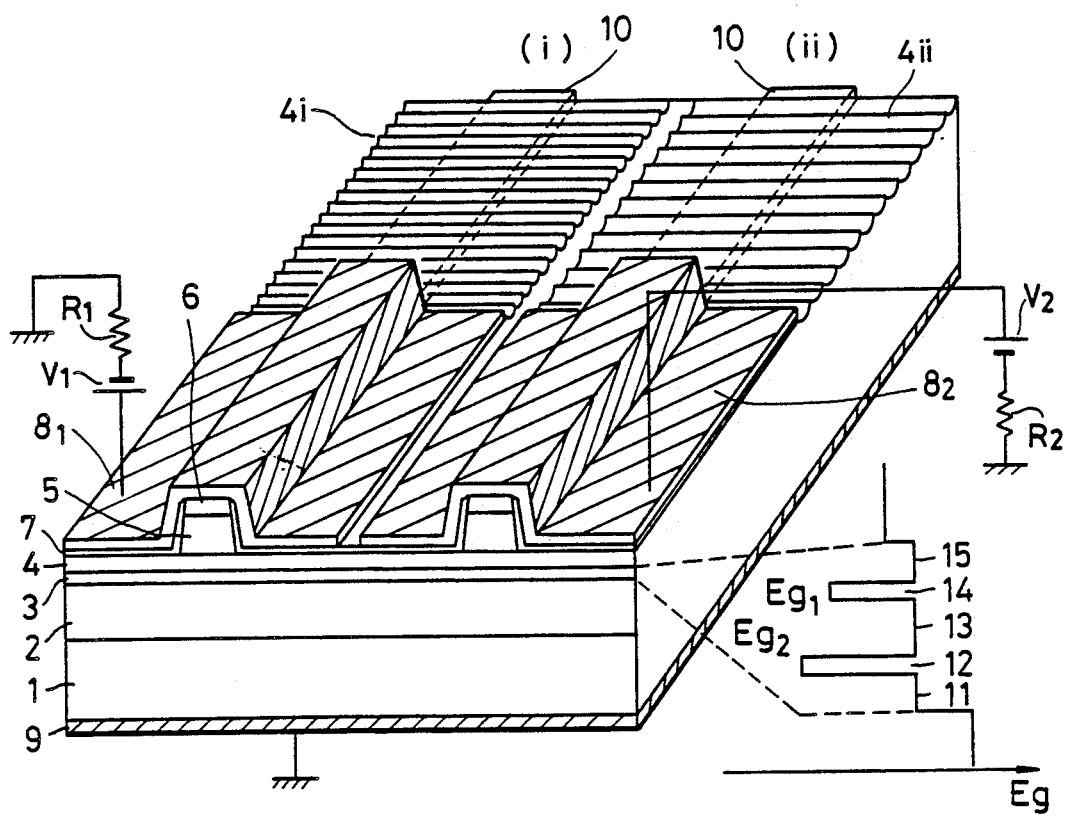
FIG. 1 is a perspective view of a semiconductor array which represents a first embodiment of the present invention together with an associated quantum well energy diagram.
Figure 3:
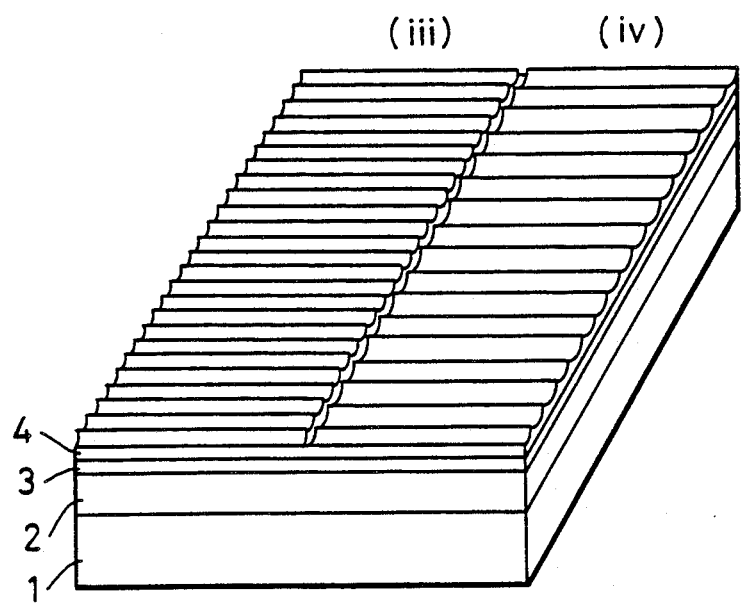
Figure 4:
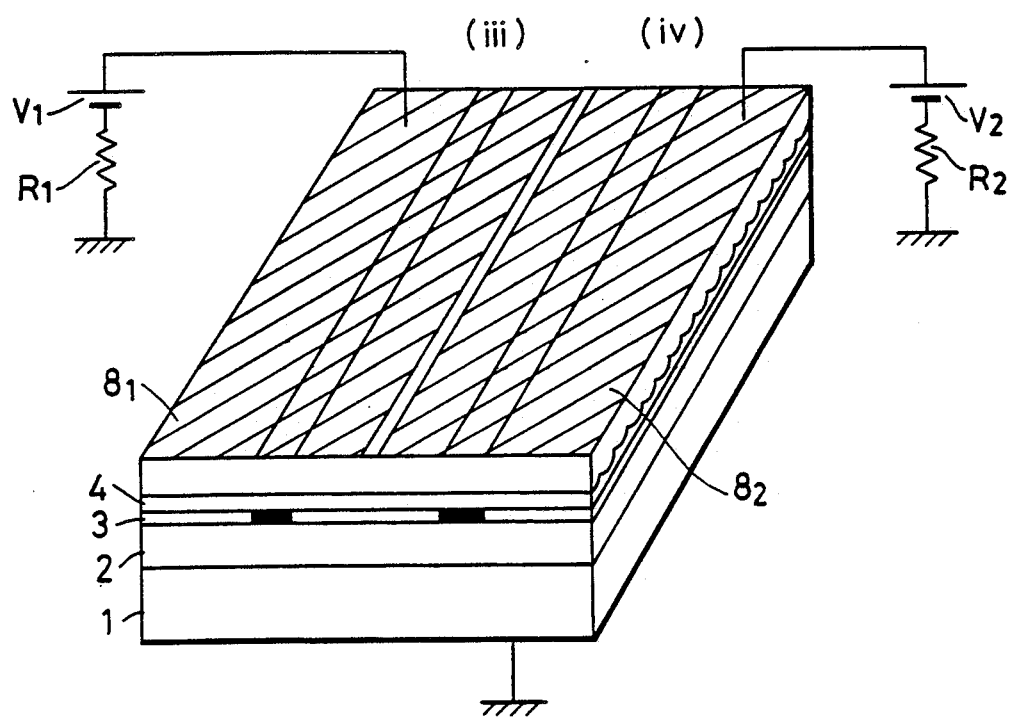
Figure 5:
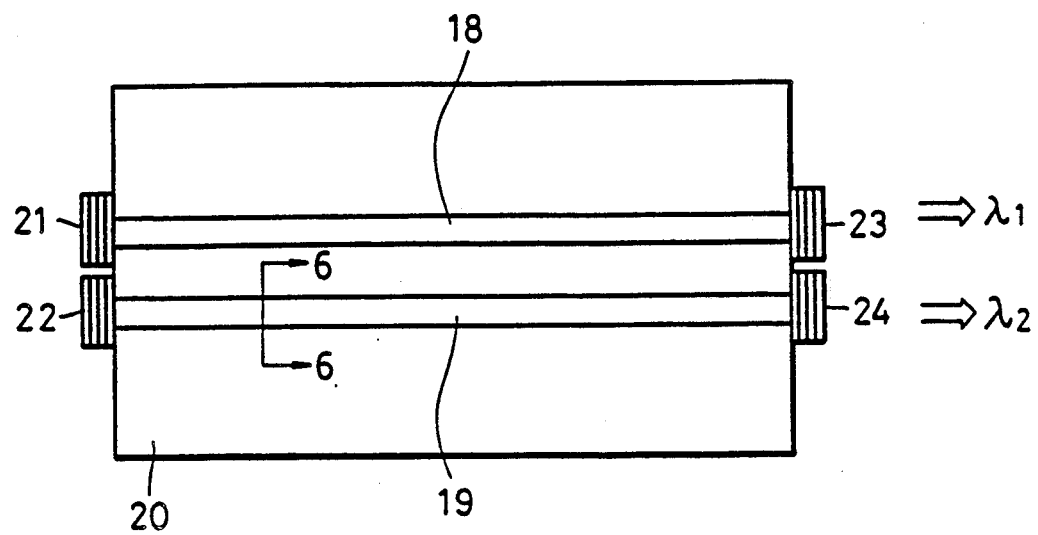
Figure 6:
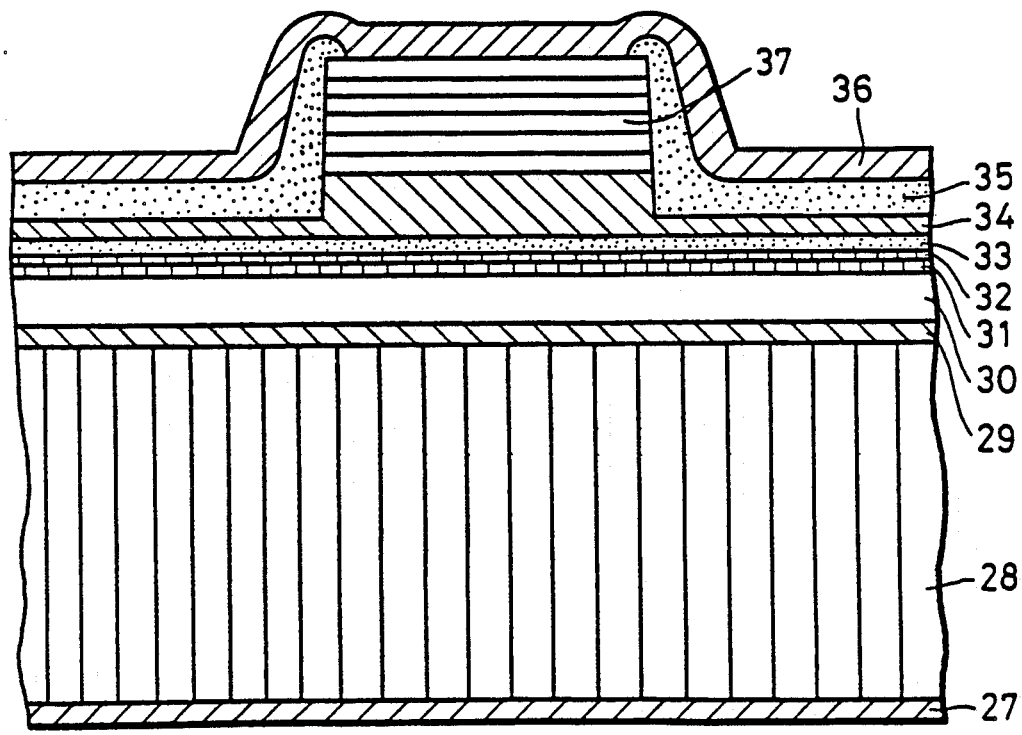
Figure 7:
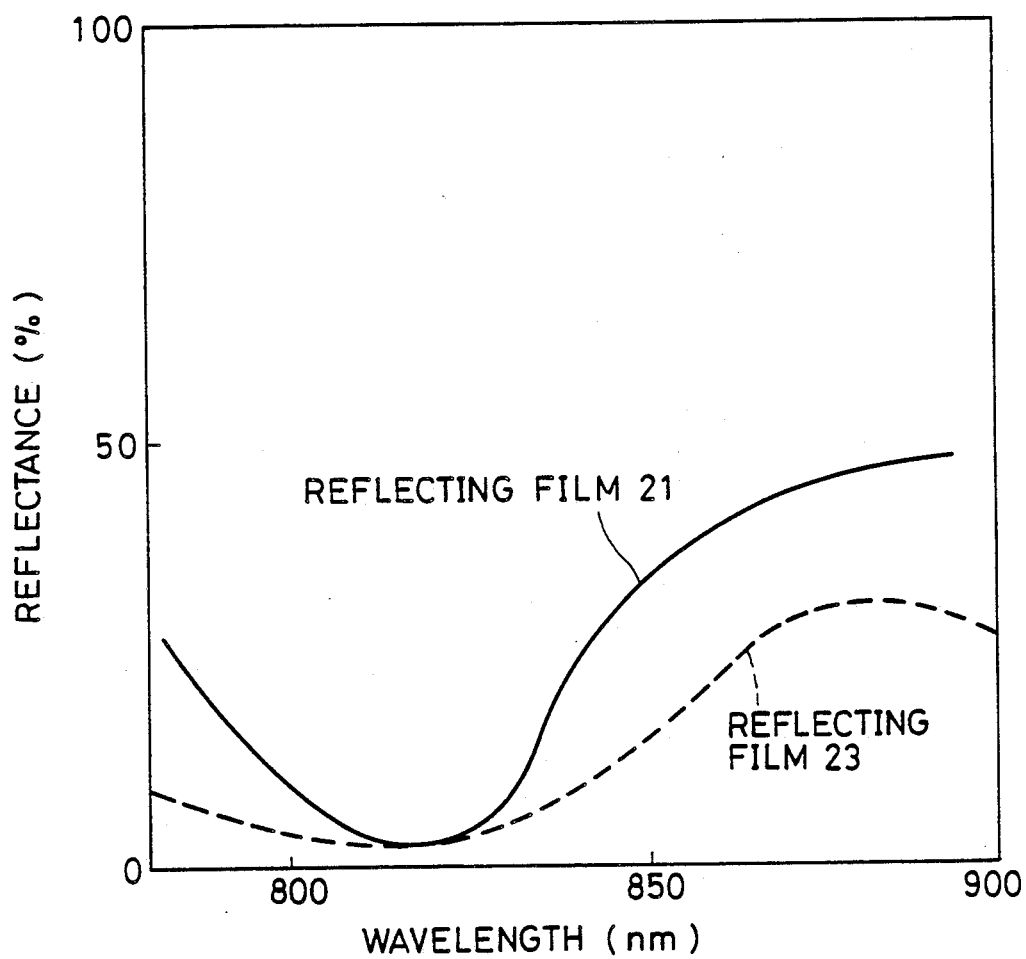
Figure 8:
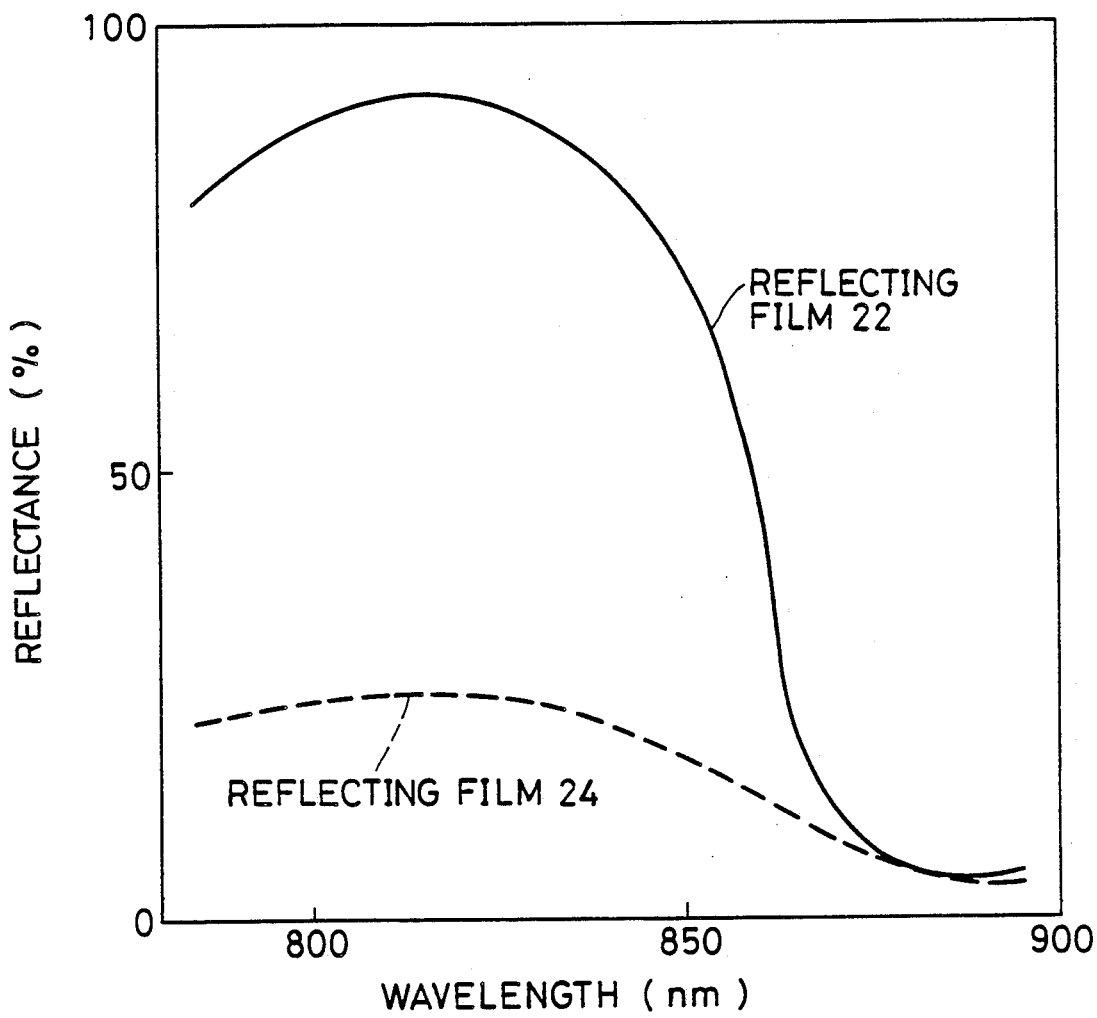
Figure 9:
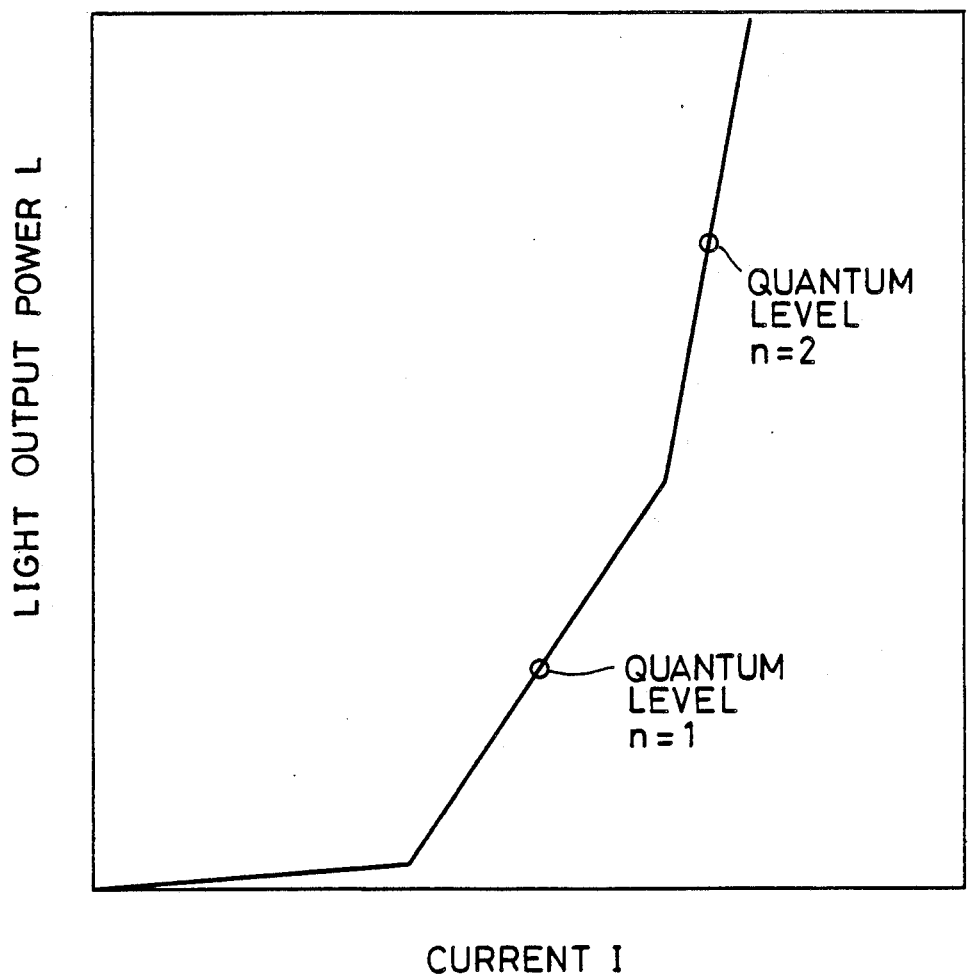
Figure 10:
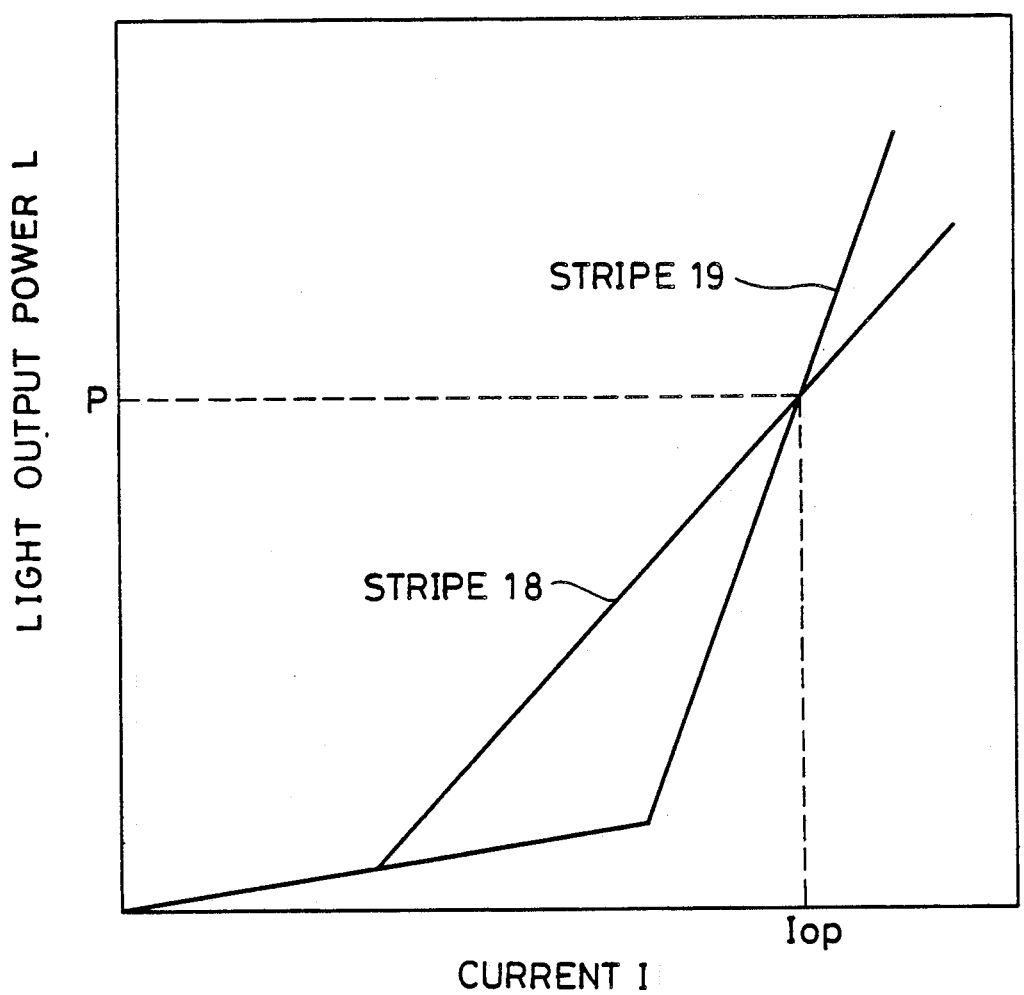
Figure 11:
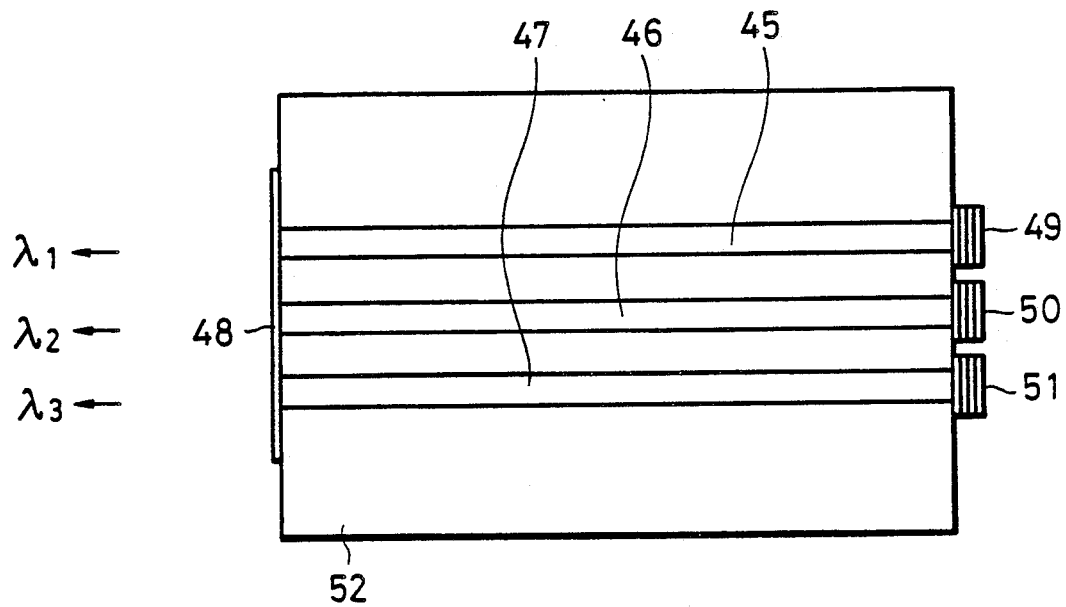
Figure 12:
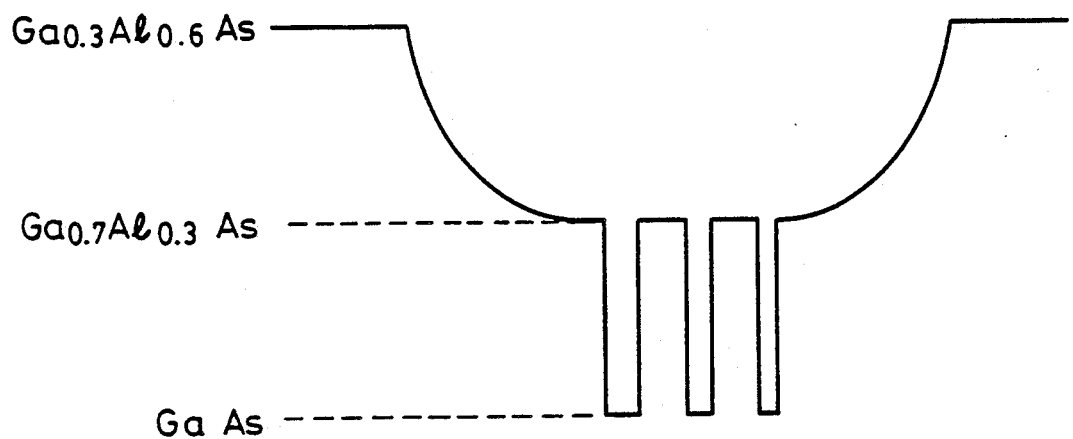
Figure 13:
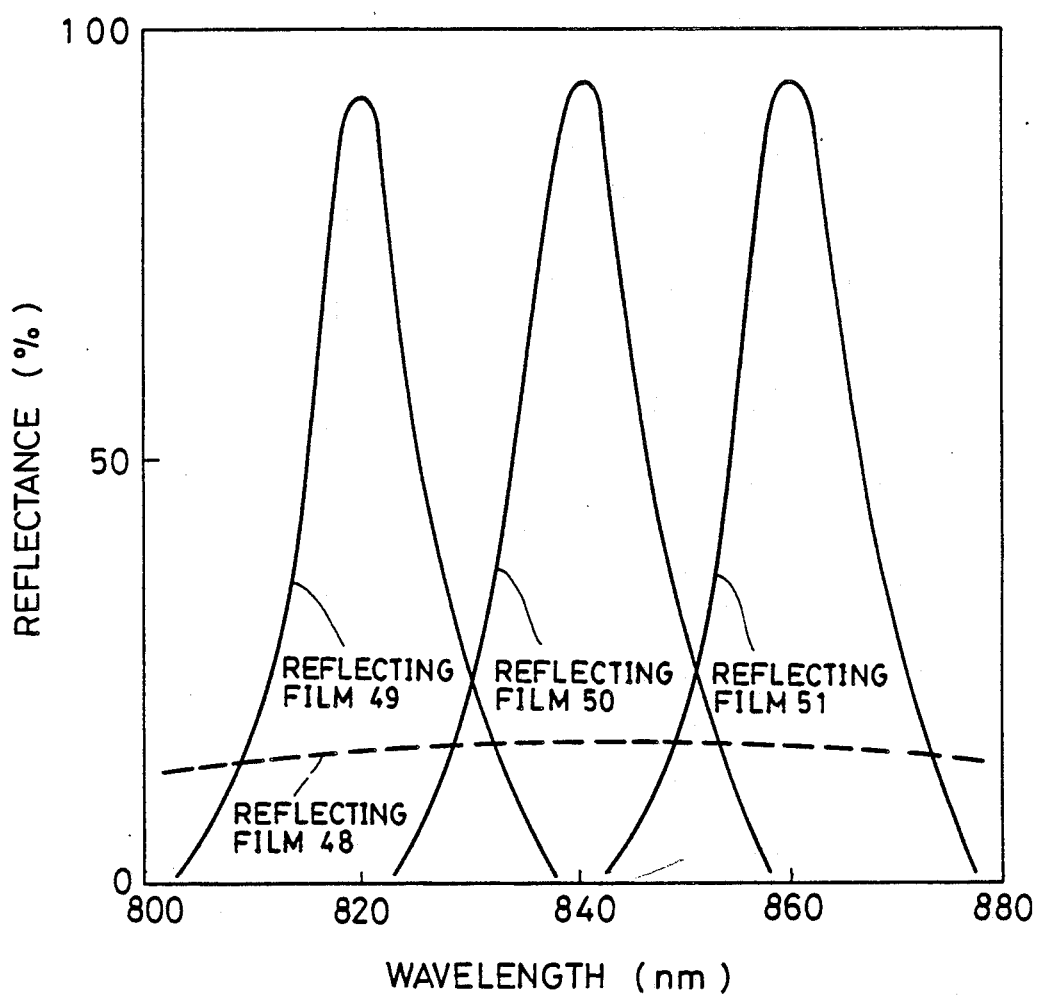

FIGS. $2A_1$, $2A_2$, $2B_1$, $2B_2$, $2C_1$, and $2C_2$ are diagrams of changes in composition in the direction of thickness of layers and energy gaps in the laser array shown in FIG. 1;

FIGS. 3 and 4 are schematic perspective views of a semiconductor laser array which represents a second embodiment of the invention in an intermediate step of its manufacturing process and in its completed state, respectively;

FIG. 5 is a schematic plan view of a semiconductor laser array which represents a third embodiment of the present invention;

FIG. 6 is a cross-sectional view of part of the laser array shown in FIG. 5 taken along the line A-B thereof;

FIGS. 7 and 8 are graphs of spectral reflectances of reflecting films used for the laser array shown in FIG. 5;

FIG. 9 is a graph of the relationship between the light output, the injection current and the quantum order in the case of a conventional laser array;

FIG. 10 is a graph of the relationship between the light output and the injection current in each active stripe region of the laser array shown in FIG. 5;

FIG. 11 is a schematic plan view of a semiconductor laser array which represents a fourth embodiment of the present invention;

FIG. 12 is a diagram of changes in composition in the direction of thickness of layers of the laser array shown in FIG. 11; and FIG. 13 is a graph of spectral reflectance characteristics of reflecting films used for the laser array shown in FIG. 11.

DESCRIPTION OF THE PREFERRED EMBODIMENTS

FIG. 1 schematically shows in perspective essential portions of a semiconductor laser array to which a distributed reflection type of laser structure is applied and which represents a first embodiment of the present invention.

This semiconductor laser array is constructed by successively forming by epitaxial growth on an $n^+$-

GaAs substrate 1 (thickness: about 100 μm) an n-Al$_{0.5}$Ga$_{0.5}$As clad layer 2 (thickness: 1.5 μm), an active layer 3 (thickness: 0.1 μm), a p-Al$_{0.2}$Ga$_{0.8}$As optical waveguide layer 4 (thickness: 0.1 μm) on which diffraction gratings 4i and 4ii, corresponding to lasers (i) and (ii) are formed, a p-Al$_{0.5}$Ga$_{0.5}$As clad layer 5 formed as ridge structures (thickness: 1.5 μm) and a p$^+$-GaAs cap layer 6 also formed as ridge structures on the laser 5 (thickness: 0.5 μm). A common electrode 9 is formed on the bottom surface of the substrate 1 and is connected to ground. For respective lasers, electrodes 8$_1$ and 8$_2$ are formed over the cap layer 6 independently of each other; and these electrodes are connected to associated current sources R$_1$, V$_1$, and R$_2$, V$_2$, respectively. A reference character 7 denotes an insulating layer between the electrodes 8$_1$ and 8$_2$ on the one side and the waveguide layer 4, the clad layer 5, and the cap layer 6 on the other side.

Referring to a diagram of energy gaps on the lower right side of FIG. 1, the active layer 3 is formed of an Al$_{0.3}$Ga$_{0.7}$As light confinement layer 11 (thickness: 300 Å), a GaAs quantum well (I) layer 12 (150 Å), an AlGaAs barrier layer 13 (thickness: 100 Å), an Al$_{0.09}$Ga$_{0.91}$As quantum well (II) layer 14 and an Al$_{0.3}$Ga$_{0.7}$As light confinement layer 15 (thickness: 300 Å). The energy gaps of the quantum wells I and II are 1.444 eV and 1.554 eV, respectively, and the oscillation wavelengths thereat are 869 nm and 808 nm. Lights beams can be generated in the layers 12 and 14 independently of each other because, ordinarily, there is substantially no interference between the quantum levels of the wells separated by the barrier layer 13 provided that the thickness of the barrier layer is not smaller than 100 Å.

To select the wavelength of the light oscillation generated at the well I or II, the rate at which current flows into the active layer 3, the pitch of the diffraction grating 4i or 4ii or the equivalent refractive index of the optical waveguide 4 may be controlled. For example, the pitch Λ$_i$ of the diffraction grating 4 formed for the laser (i) is obtained from a wavelength λ$_i$ selected as desired and on the basis of an equation:

$$\Lambda_i = l \cdot \frac{\lambda_i}{2n_{eff(i)}} \quad (1)$$

(where l is an integer which represents the diffraction order, 2n$_{eff(i)}$ represents the equivalent diffraction factor, and i is a symbol designating each unit semiconductor laser). Oscillation can be thereby effected stably with different values of the wavelength λ$_i$. For the laser (ii) each of the subscripts i in equation (1) is replaced by ii.

Referring to FIG. 1, the front section in which the electrodes 8$_1$ and 8$_2$ are provided is formed with a dual ridge structure (each ridge bottom width: about 2 to 5 μm) which defines an active region. This ridge structure is made by partially cutting the lamination to the upper surface of the optical waveguide layer 4 in a selective etching manner after all the layers have been formed. This partial and selective etching may be performed by a method based on a process in which a composition having a larger value of x of Al$_x$Ga$_{1-x}$As is etched faster by NaOH and H$_2$O$_2$. Flat surfaces are thereby formed with ridge portions left therebetween. Additional ridge structures may be formed in the same manner.

The diffraction gratings 4i and 4ii are formed over the optical waveguide layer 4 at the rear of the active region. Each diffraction grating is formed with a pitch corresponding to the desired oscillation frequency obtained from the equation (1). For the formation of each grating, the conditions of the two beam interference exposure method for forming the resist are changed as desired.

In a case where second-order diffraction (l=2) is effected, n$_{eff(i)}$ with respect to the laser (i) shown in FIG. 1 is 3.430 and the grating pitch Λ$_i$=2356 Å is selected in order to effect oscillation with λ$_i$=808 nm. In this case also, n$_{eff(ii)}$ with respect to the laser (ii) is 3.374 and the grating pitch Λ$_{ii}$=2576 Å is selected in order to effect oscillation with λ$_{ii}$=869 nm.

To optimize the efficiency of reflection of light within the region where each diffraction grating is disposed (DBR region, length: 400 μm), an SiO$_2$ dielectric element 10 is provided lengthwise in alignment with each ridge structure.

In this embodiment, the active layer 3 has a type of structure including two independent quantum wells I and II equal to each other in width but different in composition. In accordance with the present invention, a plurality of quantum wells having levels with different energy gaps may be provided in the active layer 3. For example, quantum well structures having changes in composition such as those shown in FIGS. 2A to 2C can be applied.

Each of the graphs in FIGS. 2A$_1$, 2B$_1$ and 2C$_1$ shows changes in x of Al$_x$Ga$_{1-x}$As (abscissa) in the direction of the thickness of the layer (ordinate) while each of the graphs in FIGS. 2A$_2$, 2B$_2$ and 2C$_2$ shows changes in the energy gap (abscissa) in the direction of the thickness of the layer (ordinate). That is, these Figures show changes in the compositions and energy gaps of different types of quantum well structures.

The quantum wells in the structure shown in FIGS. 2A$_1$ and 2A$_2$ are equal in width but different in composition, the quantum wells in the structure shown in FIGS. 2B$_1$ and 2B$_2$ are different in width but equal in composition, and the quantum wells in the structure shown in FIGS. 2C$_1$ and 2C$_2$ differ from each other in both width and composition. In either case, the energy gaps are made different from each other, as can be understood from the graph on the right-hand side.

Each illustrated type of quantum well structure can be provided with a plurality of energy gaps and can be applied to effect oscillation with the desired wavelength by selecting the structure of the DBR region for each unit semiconductor laser or, more specifically, the pitch of the mated diffraction grating. That is, it is possible to select and utilize the desired one of a plurality of energy gaps by providing the diffraction grating pitch necessary for bragg reflection of light emitted by the energy gap necessary for oscillation with the desired wavelength.

In the applied quantum well structure, the number of quantum wells, the well width, the composition and so on may be selected as desired so as to maximize the gain of oscillation of light having the desired wavelength.

The two-wavelength semiconductor laser array in accordance with this embodiment enables oscillation with a wavelength stably maintained and is therefore suitable for application to light sources for multi-wavelength-light communication.

For instance, it is possible to construct a system in which semiconductor lasers of the above-described type are provided in each of n units, the units operate to effect oscillation with wavelengths $\lambda_1$ and $\lambda_2$, $\lambda_1$ and $\lambda_3$, $\lambda_1$ and $\lambda_4$, ..., $\lambda_1$ and $\lambda_n$, the wavelength $\lambda_1$ being used for a control signal and the other wavelengths being used for transmission of data.

FIGS. 3 and 4 show in perspective a second embodiment of the present invention having a DFB structure.

FIG. 3 is a perspective view of a stage of formation of a laser array at which an optical waveguide layer 4 having two different diffraction grating sections (iii) and (iv) is formed over an active layer 3. The grating pitches in the sections (iii) and (iv) are selected to obtain the desired oscillation wavelengths $\lambda_3$ and $\lambda_4$. The diffraction grating pitch is set so as to satisfy the relationship defined by the equation 1.

After the formation of the diffraction gratings has been completed, a clad layer and a cap layer (not shown) are formed over the gratings, and a working and/or regrowth process is thereafter conducted if necessary, thereby forming a refractive index waveguide type structure. Independent electrodes $8_1$ and $8_2$ for independently driving the sections (iii) and (iv) are finally formed by deposition, thereby obtaining a semiconductor laser array such as that shown in FIG. 4. These electrodes are connected to current sources $V_1$, $R_1$ and $V_2$, $R_2$, respectively. The active layer 3 common to the unit semiconductor lasers of this laser array is formed to have a quantum well structure similar to that of the first embodiment and which is optimized to select the desired oscillation wavelengths $\lambda_3$ and $\lambda_4$.

The above-described laser arrays are examples of monolithic semiconductor laser arrays for effecting oscillation of two laser light beams having different wavelengths. However, the number of unit semiconductor lasers integrated can be increased as desired. A semiconductor laser array capable of oscillating two or more laser lights having different wavelengths in accordance with the present invention is suitable for multi-wavelength-light communication requiring two or more wavelengths.

In the first embodiment exemplifying a case where lasers having a DBR structure are used, the DBR region having the diffraction gratings is formed in the rear section alone. However, another DBR region may be formed in front of the waveguide to control the bragg reflectance by changing the length thereof. It is thereby also possible to change the threshold current or efficiency or to reduce the longitudinal mode spectrum line width. Each DBR region may be embedded by a regrowth process.

FIG. 5 is a schematic plan view of a semiconductor laser array which represents a third embodiment of the present invention, and FIG. 6 is a cross-sectional view of part of the laser array shown in FIG. 5 taken along the line A-B thereof.

The semiconductor laser array in accordance with this embodiment is constructed by successively laminating, on an n-GaAs substrate 28 (thickness: 100 μm), an n-GaAs buffer layer 29 (thickness: 0.5 μm), an n-AlGaAs clad layer 30 (thickness: 0.5 μm), an n-AlGaAs separate confinement (SC) layer 31 (thickness: 150 Å) in which the compositions is gradually changed in the direction of the thickness, an active layer 32 (thickness: 100 Å) having a GaAs single Quantum well (SQW) structure, a p-AlGaAs SC layer 33 (thickness: 150 Å) in which the compositions is gradually changed in the direction of the thickness, a p-AlGaAs clad layer 34 (thickness in a ridge structure: 1.5 μm), and a p-GaAs cap layer 37 (thickness: 0.5 μm).

In this embodiment, current restriction and light confinement are effected by ridge structures (width of each ridge: 2.5 μm, distance between the upper end of SC layer 33 and the lower ends of ridge sides: 0.3 μm). These ridge structures define an active stripe regions 18 and 19.

The ridge structure may be formed a process of forming the above lamination structure, etching the same so as to leave the necessary portion in the form of stripes and forming an SiN insulating layer 35, and an Au electrode 36 on each stripe. Au electrodes (common electrode 27 and independent electrodes 36) are alloyed with the n-GaAs substrate 28 and p-GaAs cap layer 37, respectively.

In the active layer 32, the composition of wells comprises GaAs, the well width is 100 Å, and the composition of a barrier comprises $Ga_{0.7}Al_{0.3}As$. There are two quantum levels of n=1 and n=2. If oscillation is effected by utilizing the quantum level of n=1, laser light having a wavelength of 870 nm can be emitted. In the case of oscillation at the quantum level of n=2, laser light having a wavelength of 810 nm can be emitted.

Active stripe regions 18 and 19 formed on the same substrate are provided with independent electrodes, thereby being driven independently.

Reflecting films having spectral reflectance characteristics as shown in FIGS. 7 and 8 are provided in combination with end surfaces of the active stripe regions 18 and 19. That is, reflecting film coatings 21 and 23 are respectively formed on the front and rear end surfaces of the active stripe region 18, while reflecting film coatings 22 and 24 are respectively formed on the front and rear end surfaces of the active stripe region 19.

The reflecting films may be formed by depositing an insulating material such as $Al_2O_3$, $ZrO_2$, Si or the like on the end surface on the basis of an electron beam deposition method.

The reflectance of the reflecting film 21 coated over the reflecting surface of the active stripe region 18 is high with respect to light having the wavelength of 870 nm and emitted at the quantum level of n=1. This reflecting film does not substantially reflect light having the wavelength of 810 nm and emitted at the quantum level of n=2. The laser oscillation is therefore effected at the quantum level of n=1, and there is no possibility of a change in the oscillation quantum level to the quantum level of n=2 such as that occurring in the conventional laser arrays as shown in FIG. 9, even if the injection current is increased.

The reflecting films 22 and 24 of the active stripe region 19 have a low reflectance with respect to light having the wavelength of 870 nm and emitted at the quantum level of n=1. Oscillation at the quantum level of n=1 is therefore inhibited, thereby allowing a high-injection state. Oscillation with the wavelength of 810 nm is started when the electrons are injected to the quantum level of n=2. Once the oscillation is started, higher values of the emission gain and the rear end surface reflectance at the quantum level of n=2 coincide with each other, thereby effecting oscillation at high efficiency.

As a result, I-L (current-light) output characteristics of the active stripe regions 18 and 19 are exhibited as shown in FIG. 10, and substantially equal light outputs P can be obtained by equal drive currents.

In the above described arrangement, the stripes 18 and 19 enable oscillation of laser lights having wavelength of 810 nm and 870 nm by equal drive currents of 60 mA.

Consequently, there if no dispersion of the thermal characteristics of the active stripes. (That is, the quantities of heat generated in the respective active stripes are equalized.)

FIG. 11 shows schematically in plan portions of a semiconductor laser array which represents a fourth embodiment of the present invention.

The structure of the semiconductor laser array of this embodiment is substantially the same as the structure shown in FIG. 5, but differs from the same in that the active layer has a multiple quantum well structure in which GaAs wells having widths of 80 Å, 55 Å and 40 Å, respectively, as shown in FIG. 12, are successively laminated within the SC layer.

These wells as spaced apart from each other by 100 Å in order to prevent interference between electron waves.

If a current (about 80 mA) is injected into this active layer, light is emitted from the respective wells at wavelengths of 820, 840, and 860 nm.

Reflecting film coatings 49, 50, and 51 having different reflectances as shown in FIG. 13 are formed on end surfaces opposite to light emission end surfaces. A reflecting film coating 48 having a low reflectance with respect to a range of wavelengths from 820 to 860 nm is formed over the light emission end surfaces.

These reflecting films may be formed by depositing an insulating material such as $Al_2O_3$, $ZrO_2$, Si or the like on the end surface on the basis of an electron beam deposition method.

When a current (80 mA) was injected from a current source (not shown) into each of the active stripe regions 45, 46, and 47 of this semiconductor laser array, initial conditions of oscillation with wavelengths of 820, 840 and 860 nm were reached.

The present invention includes various modifications other than the above-described embodiments. For example, the structure of each laser is not limited to the ridge structure of the embodiment and may be of any type including a buried hetero- (BH) type so long as it ensures suitable effects of current restriction and light confinement. The crystalline material may be selected from various materials other than AlGaAs, including ordinary compound semiconductors such as InGaAsP- and AlGaInP-compounds.

It is to be construed that the present invention involves any changes and modifications so long as they fall into the scope set forth in the appended claims.

What is claimed is:

1. A semiconductor laser array comprising a plurality of lasers having, within an active layer, a quantum well structure with at least two quantum well levels for generating, respectively and independently of each other, laser light beams of mutually different oscillation wavelengths and reflecting means associated with each of said quantum well levels and having wavelength selection properties corresponding to each of said mutually different oscillation wavelengths.

2. A semiconductor laser array according to claim 1, wherein said reflecting means includes diffraction gratings respectively provided for said semiconductor lasers, said diffraction gratings having different grating pitches.

3. A semiconductor laser array according to claim 2, wherein the pitch of one of said diffraction gratings is $\Lambda_i$, the wavelength of oscillation effected by the corresponding one of said semiconductor lasers is $\lambda_i$, the equivalent diffractive index of said corresponding one of said lasers is $n_{eff(i)}$, the diffraction order is integer l, and i = 1, 2, ..., and the following equation is satisfied:

$$\Lambda_i = l \cdot \frac{\lambda_i}{2n_{eff(i)}}$$

4. A semiconductor laser array according to claim 1, wherein said reflecting means includes reflecting films having different spectral reflectance characteristics and coated over end surfaces of said semiconductor lasers at least on one side thereof.

5. A semiconductor laser array according to claim 4, wherein each of said reflecting films has a higher reflectance with respect to the wavelength of oscillation effected by a corresponding one of said semiconductor lasers.

6. A semiconductor laser array according to claim 1, wherein said active layer has a single quantum well structure having one quantum well.

7. A semiconductor laser array according to claim 6, wherein said quantum well has a plurality of quantum levels corresponding to the oscillation wavelengths of said lasers.

8. A semiconductor laser array according to claim 1, wherein said active layer has a multiple quantum well structure.

9. A semiconductor laser array according to claim 8, wherein said active layer includes a plurality of quantum wells respectively having quantum levels corresponding to the oscillation wavelengths of said lasers.

10. A semiconductor laser array according to claim 9, wherein said quantum wells have equal compositions and different widths.

11. A semiconductor laser array according to claim 9, wherein said quantum wells have different compositions and equal widths.

12. A semiconductor laser array according to claim 9, wherein said quantum wells have different compositions and different widths.

13. A semiconductor laser array comprising:
a first semiconductor laser having, within an active layer, a quantum well structure with at least two quantum levels, said first semiconductor laser being constructed to emit light having a first wavelength;
a second semiconductor laser having, within an active layer, a quantum well structure with at least two quantum levels, said second semiconductor laser being constructed to emit light having a second wavelength, the active layer of said second semiconductor laser being formed together with said first semiconductor laser in a substrate in a monolithic construction;
first reflecting means provided for said first semiconductor laser, said first reflecting means being constructed to reflect light having said first wavelength with a reflectance higher than that with which said first reflecting means reflects light having said second wavelength; and
second reflecting means provided for said second semiconductor laser, said second reflecting means being constructed to reflect light having said second wavelength with a reflectance higher than that with which said second reflecting means reflects light having said first wavelength.

14. A semiconductor laser array according to claim 13, wherein said reflecting means include first and second diffraction gratings respectively provided for said first and second semiconductor lasers and having mutually different pitches.

15. A semiconductor laser array according to claim 14, wherein if the pitches of said first and second diffraction gratings are respectively $\Lambda_1$ and $\Lambda_2$, said first and second wavelengths are respectively $\lambda_1$ and $\lambda_2$, the equivalent diffractive indexes of said first and second semiconductor lasers are $n_{eff(1)}$ and $n_{eff(2)}$, and the diffraction order is an integer l, the following equations are satisfied:

$$\Lambda_1 = l \cdot \frac{\lambda_1}{2n_{eff(1)}} ; \text{ and}$$

$$\Lambda_2 = l \cdot \frac{\lambda_2}{2n_{eff(2)}} .$$

16. A semiconductor laser array according to claim 13, wherein said reflecting means include reflecting films having mutually different spectral reflectance characteristics and coated over end surfaces of said first and second semiconductor lasers at least on one side thereof.

17. A semiconductor laser array according to claim 13, wherein at least one of said active layers has a single quantum well structure having one quantum well.

18. A semiconductor laser array according to claim 17, wherein said one quantum well has first and second quantum levels corresponding to said first and second wavelengths.

19. A semiconductor laser array according to claim 13, wherein at least one of said active layers has a multiple quantum well structure.

20. A semiconductor laser array according to claim 19, wherein said one active layer includes a first and second quantum wells respectively having quantum levels corresponding to said first and second wavelengths.

21. A semiconductor laser array according to claim 20, wherein said first and second quantum wells have equal compositions and different widths.

22. A semiconductor laser array according to claim 20, wherein said first and second quantum wells have different compositions and equal widths.

23. A semiconductor laser array according to claim 20, wherein said first and second quantum wells have different compositions and different widths.

* * * * *